US006744280B2

United States Patent
Morgan et al.

(10) Patent No.: US 6,744,280 B2
(45) Date of Patent: Jun. 1, 2004

(54) VOLTAGE OUTPUT DIFFERENTIAL (VOD) CORRECTION CIRCUIT FOR DIFFERENTIAL DRIVERS

(75) Inventors: Mark W. Morgan, Allen, TX (US); Fernando D. Carvajal, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 10/143,299

(22) Filed: May 9, 2002

(65) Prior Publication Data
US 2003/0210074 A1 Nov. 13, 2003

(51) Int. Cl.[7] .............................................. H03K 17/16
(52) U.S. Cl. ............................ 326/86; 326/83; 326/30; 327/321; 327/513; 327/378; 327/108; 327/87
(58) Field of Search .............................. 326/81, 86, 82, 326/90, 83; 327/108, 198, 143, 378, 513

(56) References Cited

U.S. PATENT DOCUMENTS

| 5,187,448 | A | * | 2/1993 | Brooks et al. ............... 330/258 |
|---|---|---|---|---|
| 6,208,161 | B1 | | 3/2001 | Suda |
| 6,246,262 | B1 | | 6/2001 | Morgan et al. |
| 6,285,232 | B1 | | 9/2001 | Hasegawa |
| 6,288,581 | B1 | | 9/2001 | Wong |
| 6,297,685 | B1 | * | 10/2001 | Ewen et al. ................. 327/513 |
| 6,313,662 | B1 | | 11/2001 | Ide |
| 6,369,621 | B1 | * | 4/2002 | Tinsley et al. .............. 327/108 |
| 6,411,146 | B1 | * | 6/2002 | Kuo ........................... 327/198 |

* cited by examiner

Primary Examiner—Vibol Tan
(74) Attorney, Agent, or Firm—W. Daniel Swayze, Jr.; W. James Brady; Frederick J. Telecky, Jr.

(57) ABSTRACT

System and methods are provided for monitoring circuit performance and correcting for variations in current reference signals to maintain a desired Voltage Output Differential (VOD) between the two differential output signals. A voltage signal associated with VOD is compared to a signal that is set to a desired voltage level based on a desired VOD. By determining whether the VOD level is higher or lower than the desired level, adjustments are made to at least one of an output current source level and an output current sink level. An increase in the source and sink currents at the output results in an increased VOD, while a balance decrease in the source and sink currents results in a decreased VOD.

13 Claims, 8 Drawing Sheets

VOLTAGE OUTPUT DIFFERENTIAL (VOD) CORRECTION CIRCUIT FOR DIFFERENTIAL DRIVERS

TECHNICAL FIELD

The present invention relates generally to electrical circuits and more particularly to current driven differential drivers.

BACKGROUND OF INVENTION

In a typical communication system, inter-chip high-speed communication is generally limited by the performance of driver and receiver circuits at the interface of communicating chips. Standards have been established for high-speed signal handling applications including, for example, low voltage differential signaling (LVDS) and positive emitter-coupled logic (PECL). These standards enable the design of high-speed systems with minimum power dissipation and low electromagnetic interference (EMI). However, inter-chip high-speed communication is still limited by the performance of driver and receiver circuits at the interface of these devices. The LVDS TIA/EIA-644 standard specifies an output voltage through 100 Ohms to be within 247 mv to 454 mv. This provides sufficient signal amplitude for transforming data without overdriving the connected receiver.

One limitation involves a condition known as low voltage output differential (VOD). The VOD of a differential driver is the voltage differential between the two components of the differential output signal. In systems employing LVDS, the VOD is designed to be on the order of about 400 mv. In LVDS, the lower voltage output of the differential pair is typically 1.0 V while the higher output voltage is typically 1.4 V. The difference between the two is about 400 mv while the average of the two is the common mode voltage, $V_{CM}$. For the above example, $V_{CM}$ is about 1.2V. The VOD is created by steering a constant current from one output terminal though a standard 100 ohm load resistor to the other output terminal. Current generators are typically used to establish the output currents, $I_{SOURCE}$ and $I_{SINK}$ at the two respective output terminals. When process variations cause output current sources to provide $I_{SOURCE}$ and $I_{SINK}$ values that are below specified levels, then the resulting VOD will be low. A low VOD reduces the noise immunity within the LVDS system and can impact total system performance. Low output currents often result from process variations in resistors that are used to determine the current values. As process limitations can produce variations of plus or minus 20% in resistor values, the corresponding output currents are also subject to plus or minus 20% variations that result in similar variations of VOD.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to system and methods for compensating the Voltage Output Differential (VOD) of current driven driver circuits (e.g., LVDS driver circuits) to maintain a desired VOD during driver operation. The system and methods provide for monitoring internal circuit performance and correcting for variations in output current supplied to maintain a desired VOD between the two differential output signals. The present invention provides for comparing the voltage of a representative signal that is based on the VOD with a reference signal that is set to a desired voltage level based on a desired VOD. By determining whether the representative voltage level is higher, equal to, or lower than the desired reference level, balanced adjustments may be made to at least one of the output current source level and the output current sink level to alter the VOD. Balancing the adjustment to the two current sources maintains the existing desired common mode voltage ($V_{CM}$). A balanced increase in the source and sink currents at the output results in an increased, VOD while a balanced decrease in the source and sink currents results in a decrease in VOD.

In one aspect of the present invention, a representative DC signal of the VOD is compared with a reference signal that is set to a desired level. The representative DC signal varies in voltage level by a known offset. The reference signal is set to a value equal to the desired output voltage level plus the known offset. A common mode voltage ($V_{CM}$) regulator is employed to maintain $V_{CM}$ equal to the average of the two output voltage levels. Since $V_{CM}$ is known, monitoring either the higher differential output voltage or the lower differential output voltage is equivalent to monitoring the VOD. If VOD is low, the output source current and/or the output sink current is increased such that VOD is restored to the desired level. This is accomplished by increasing (e.g., adding) current to a current source that is reflected to at least one of the source current and sink current until the desired VOD is achieved. Similarly, if VOD is high, one or both of the output source current and output sink current are decreased such that VOD is restored to the desired level. This is accomplished by decreasing the current to a current source that is reflected to one or both the source current and the sink current until the desired VOD is achieved.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention provides systems and methodologies to correct voltage output differential (VOD) variations that result from process variations in current driven drivers, such as Low Voltage Differential Signal (LVDS) drivers. VOD variations result when the resistance values of resistors that determine reference currents vary as a function of the manufacturing process. The reference currents are reflected through a series of current mirrors to create output source and output sink currents that drive a specified load. The voltage created by the output currents that flow through the load provides the VOD. The VOD is the difference in voltage between the high and low output signals of a differential driver pair. The present invention utilizes a compensation device (e.g., differential comparator circuit) that compares an internal DC signal that is based on the VOD to an established reference voltage level, and generates a current stimulus that modifies current through the driver outputs to maintain a desired VOD. The internal DC signal has a known relationship to the VOD.

In one aspect of the invention, a compensation or correction circuit is employed that determines the results of a comparison of an internal DC signal based on the VOD and an established reference voltage level, and provides a correction current that will either be added, or subtracted, to a reference current that is reflected through a series of current mirrors to create an adjustment in one or both the source and sink currents of the output of the driver. Balancing the adjustment between the source and the sink currents maintains the established common mode voltage ($V_{CM}$). $V_{CM}$ is the average of the high and low differential outputs.

Figure 1:
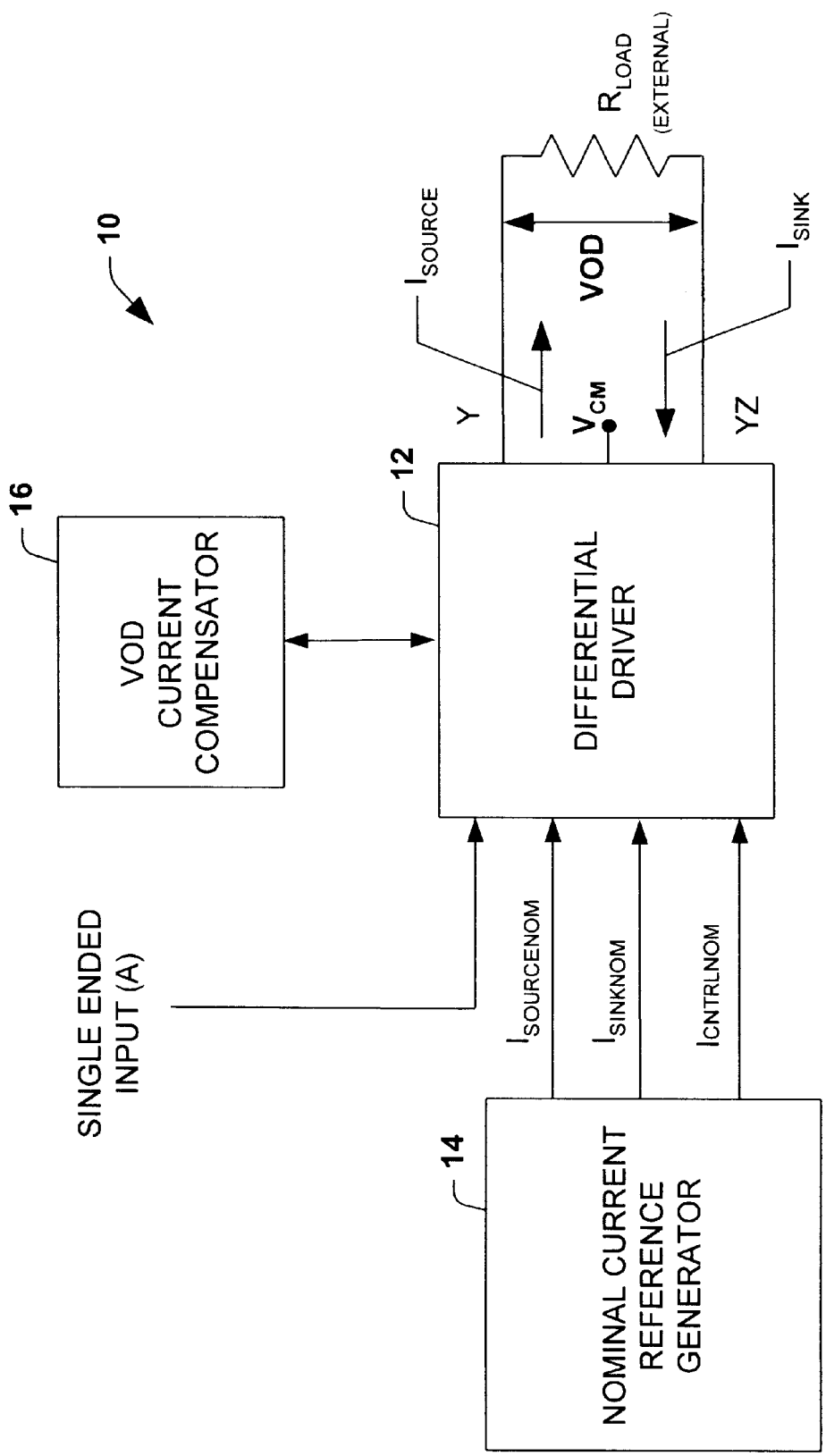
FIG. 1 illustrates a block diagram of a driver system in accordance with an aspect of the present invention.

FIG. 1 is a block diagram of a driver system 10 that regulates the VOD of the differential outputs in accordance with an aspect of the present invention. The driver system 10 consists of a differential driver 12, a nominal current reference generator 14, and a VOD current compensator 16. The nominal current reference generator 14 generates reference current signals that in part determine the output currents $I_{SOURCE}$ and $I_{SINK}$ in addition to regulating the common mode voltage ($V_{CM}$) of the differential driver 12. The reference current signals include $I_{SOURCENOM}$, $I_{SINKNOM}$ and $I_{CNTRLNOM}$. The differential driver 12 utilizes the reference current signal $I_{SOURCENOM}$ to generate $I_{SOURCE}$ and the reference current signal $I_{SINKNOM}$ to generate $I_{SINK}$. The differential driver 12 utilizes the reference current signal $I_{CNTRLNOM}$ to modify $I_{SOURCE}$ and $I_{SINK}$ to sustain a desired $V_{CM}$ voltage level The differential driver 12 receives a singled ended input signal (A), and converts it to a pair of differential output signals Y and YZ. The differential driver 12 drives output currents $I_{SOURCE}$ and $I_{SINK}$ through a load resistance ($R_{LOAD}$) that is external to the driver system 10. The voltage differential across the output nodes Y and YZ is known as the voltage output differential (VOD). The VOD current compensator 16 determines if the resulting VOD is low. If the resultant VOD is low, the VOD current compensator 16 adds current that results in an increase to at least one of the output currents $I_{SOURCE}$ and $I_{SINK}$. If the resultant VOD is high, the VOD current compensator 16 subtracts current that results in a decrease to at least one of the output currents $I_{SOURCE}$ and $I_{SINK}$ It is to be appreciated that although $I_{SOURCE}$ is illustrated as flowing through top terminal Y and $I_{SINK}$ is illustrated as flowing through the bottom terminal YZ, the direction $I_{SOURCE}$ can be through terminal YZ and the direction of $I_{SINK}$ can be through terminal Y. The direction that the current $I_{SOURCE}$ and $I_{SINK}$ are steered determines whether the output signal is a logic high or a logic low. In the example of FIG. 1, the direction of $I_{SOURCE}$ is illustrated as flowing through terminal Y and the direction of $I_{SINK}$ is illustrated as flowing through terminal YZ indicating a logic high.

Figure 2:
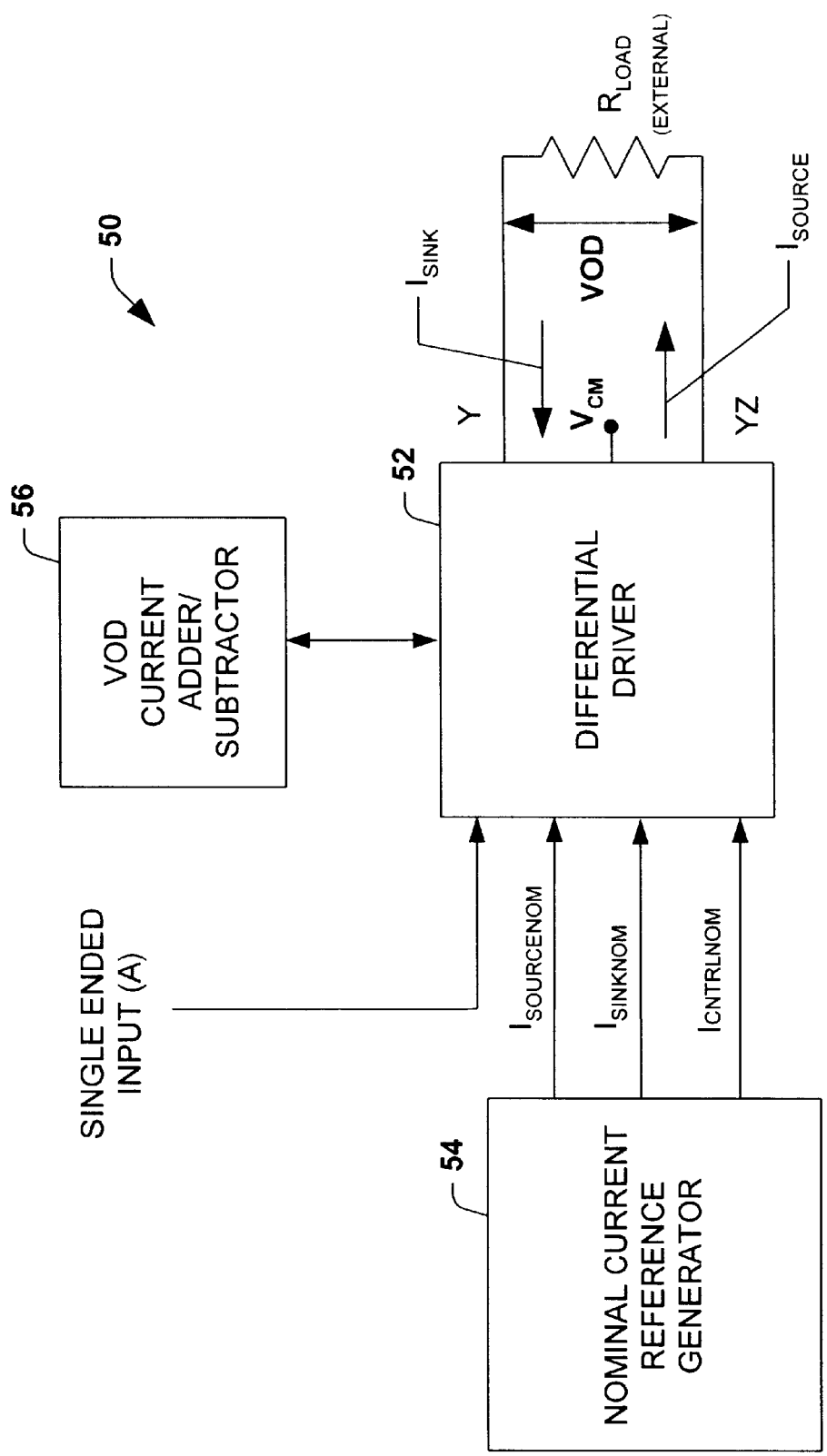
FIG. 2 illustrates a block diagram of an alternate driver system in accordance with another aspect of the present invention.

FIG. 2 is a block diagram of an alternate driver system 50 that regulates the VOD of the differential outputs in accordance with another aspect of the present invention. The driver system 50 consists of a differential driver 52, a nominal current reference generator 54, and a VOD current adder/subtractor 56. The nominal current reference generator 54 generates reference current signals that in part determine the nominal output currents $I_{SOURCE}$ and $I_{SINK}$ in addition to regulating the common mode voltage ($V_{CM}$) of the differential driver 52. The reference current signals include $I_{SOURCENOM}$, $I_{SINKNOM}$ and $I_{CNTRLNOM}$. The differential driver 52 utilizes the reference current signal $I_{SOURCENOM}$ to generate $I_{SOURCE}$ and the reference current signal $I_{SINKNOM}$ to generate $I_{SINK}$. The differential driver 52 utilizes the reference current signal $I_{CNTRLNOM}$ to modify $I_{SOURCE}$ and $I_{SINK}$ to sustain a desired $V_{CM}$ voltage level, The differential driver 52 receives a singed ended input signal (A), and converts it to a pair of differential output signals Y and YZ. The differential driver 52 drives output currents $I_{SOURCE}$ and $I_{SINK}$ through a load resistance ($R_{LOAD}$) that is external to the driver system 50. The VOD current adder/subtractor 56 determines if the resulting VOD is low or high. If the resultant VOD is low, the VOD current adder/subtractor 56 adds current that results in an increase to at least one of the output currents $I_{SOURCE}$ and $I_{SINK}$. If the resultant VOD is high, the VOD current adder/subtractor 56 subtracts current that results in a decrease to at least one of the output currents $I_{SOURCE}$ and $I_{SINK}$. In the example of FIG. 2, the direction of $I_{SOURCE}$ is illustrated as flowing through terminal YZ and the direction of $I_{SINK}$ is illustrated as flowing through terminal Y indicating a logic low. It is to be appreciated that the adder portion or the subtractor portion of the VOD current adder/subtractor 56 can be implemented without the other if desired for a particular implementation.

Figure 3:
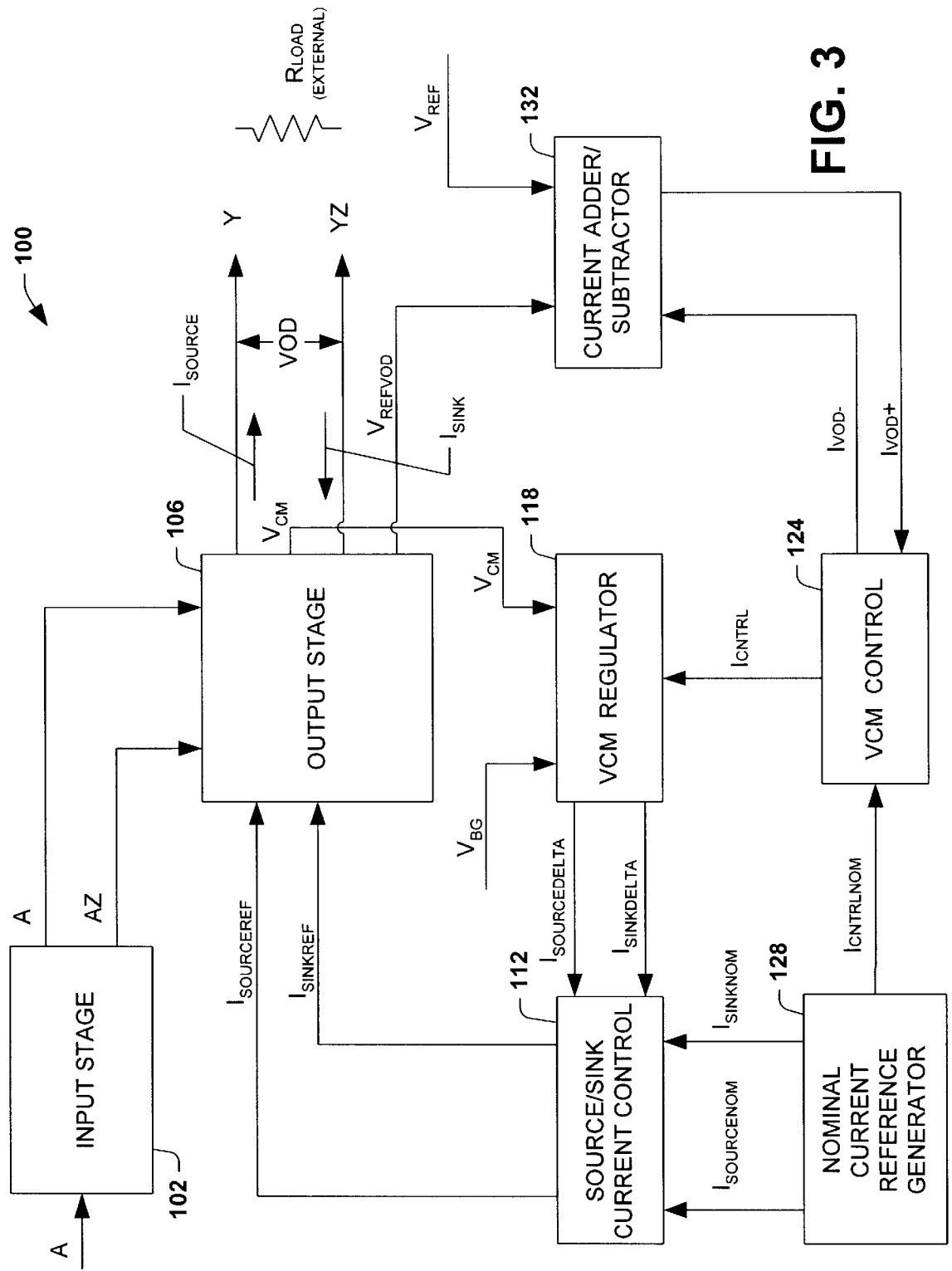
FIG. 3 illustrates a functional block diagram of a differential driver system with VOD regulation in accordance with an aspect of the present invention.

FIG. 3 illustrates a differential driver system 100 that includes VOD regulation in accordance with an aspect of the present invention. In system 100, input signal A is a single ended input such as a TTL input provided to an input state 102. It is to be appreciated that signal A can be any singled ended or rail-to-rail input signal. The input stage 102 receives input signal A and provides signal A and signal AZ (the inverse of signal A) to an output stage 106. The output stage 106 also receives currents $I_{SOURCEREF}$ and $I_{SINKREF}$ from a Source/Sink Current Controller 112. The output stage 106, based on the logic levels of the inputs received, drives output currents $I_{SOURCE}$ and $I_{SINK}$ from terminals Y and YZ to an external load. The output currents $I_{SOURCE}$ and $I_{SINK}$ are derived from the currents $I_{SOURCEREF}$ and $I_{SINKREF}$ from the Source/Sink Current Controller 112. The VOD is measured across terminals Y and YZ as a function of the output currents $I_{SOURCE}$ and $I_{SINK}$ driven through external load $R_{LOAD}$.

The output stage 106 also provides two reference signals, $V_{CM}$ and $V_{REFVOD}$, that are used in part to control the output currents $I_{SOURCE}$ and $I_{SINK}$ $V_{CM}$ is the common mode voltage that represents the average of the voltage level between terminal Y and ground and between terminal YZ and ground. $V_{CM}$ is provided by the output stage 106 to a $V_{CM}$ regulator 118 and is used in keeping $I_{SOURCE}$ and $I_{SINK}$ balanced such that the desired $V_{CM}$ is achieved. The other output signal, $V_{REFVOD}$, provides a signal that is a function of VOD. $V_{REFVOD}$ is utilized by a current/adder subtractor 132 in maintaining VOD at an appropriate level.

The common mode voltage is controlled by the $V_{CM}$ Regulator 118. The $V_{CM}$ regulator 118 receives signal $V_{CM}$ from the output stage and compares $V_{CM}$ with known reference signal $V_{BG}$ (Bandgap Voltage). $V_{BG}$ is set to be equal to the desired value of $V_{CM}$. In the case of an LVDS driver, $V_{BG}$ is typically set equal to about 1.2 volts. Another input to the $V_{CM}$ regulator 118 is a current, $I_{CNTRL}$ which originates in a VCM control 124. Under nominal operating conditions, $I_{CNTRL}$ will be equally divided into two currents, $I_{SOURCEDELTA}$ and $I_{SINKDELTA}$ which are output from $V_{CM}$ regulator 118. However, if VCM is less than $V_{BG}$, then $V_{CM}$ is low and must be adjusted to a higher level. The $V_{CM}$ regulator 118 enables this result by shifting the division of $I_{CNTRL}$ between $I_{SOURCEDELTA}$ and $I_{SOURCEDELTA}$ to increase the current $I_{SOURCEDELTA}$ and decrease the current $I_{SINKDELTA}$. Similarly, if $V_{CM}$ is greater than $V_{BG}$, then $V_{CM}$ is high and must be adjusted to a lower level. The VCM regulator 118 enables this result by shifting the division of $I_{CNTRL}$ between $I_{SOURCEDELTA}$ and $I_{SOURCEDELTA}$ to decrease the current $I_{SOURCEDELTA}$ and increase the current $I_{SINKDELTA}$.

$I_{SOURCEDELTA}$ and $I_{SINKDELTA}$ are inputs to the Source/Sink Current Controller 112. The Source/Sink Current Controller 112 combines nominal reference currents, $I_{SOURCENOM}$ and $I_{SINKNOM}$, with incremental delta currents to form reference currents, $I_{SOURCEREF}$ and $I_{SINKREF}$ which are reflected by the output stage 106 as currents $I_{SOURCE}$ and $I_{SINK}$. Source/Sink Current Controller 112 combines $I_{SOURCENOM}$ with $I_{SOURCEDELTA}$ to form $I_{SOURCEREF}$. Remembering that $I_{SOURCEDELTA}$ is increased when $V_{CM}$ is low, $I_{SOURCEREF}$ will correspondingly increase and result in an increased current being reflected to $I_{SOURCE}$. Similarly, Source/Sink Current Controller 112 combines $I_{SINKNOM}$ with $I_{SINKDELTA}$ to form $I_{SINKREF}$. Remembering that $I_{SINKDELTA}$ is decreased when $V_{CM}$ is low, $I_{SINKREF}$ will correspondingly decrease and result in a decreased current being reflected to $I_{SINK}$. Increasing $I_{SOURCE}$ and decreasing $I_{SINK}$ serves to raise the level of $V_{CM}$.

A nominal current reference generator 128 generates three reference currents $I_{SOURCENOM}$, $I_{SINKNOM}$ and $I_{CNTRLNOM}$. The source/sink current control 112 utilizes the reference current signal $I_{SOURCENOM}$ to generate $I_{SOURCE}$ and the reference current signal $I_{SINKNOM}$ to generate $I_{SINK}$. The $V_{CM}$ control 124 utilizes the reference current signal $I_{CNTRLNOM}$ to generate $I_{CNTRL}$. $I_{CNTRL}$ is output from the $V_{CM}$ control 124 to the VCM Regulator 118. An increase in $I_{CNTRL}$ serves to increase the VOD observed across the output terminals Y and YZ. This is accomplished as an increase in $I_{CNTRL}$ results in an increase to at least one of $I_{SOURCEDELTA}$ and $I_{SINKDELTA}$ which in turn increases at least one of $I_{SOURCEREF}$ and $I_{SINKREF}$. An increase in at least one of $I_{SOURCEREF}$ and $I_{SINKREF}$ results in an increase in at least one of $I_{SOURCE}$ and $I_{SINK}$ causing an increase VOD across terminals Y and YZ while still maintaining a constant $V_{CM}$.

$I_{VOD+}$ and $I_{VOD-}$ are determined by the Current Adder/Subtractor 132. The Current Adder/Subtractor compares a signal, $V_{REFVOD}$, related to VOD, to a known reference input $V_{REF}$. $V_{REF}$ is set to a predetermined value that corresponds to the expected value of $V_{REFVOD}$ for the desired level of VOD. If VOD is low, then $V_{REFVOD}$ will be low and the Current Adder/Subtractor 132 creates an adder current $I_{VOD+}$ which is output to the VCM control 124 and results in an increase to $I_{CNTRL}$. Similarly, if VOD is high, the $V_{REFVOD}$ will be high and the Current Adder/Subtractor 132 creates a subtractor current $I_{VOD-}$ which is output to the VCM control 124 and results in a decrease to $I_{CNTRL}$. As described above, the present invention adjusts the output currents $I_{SOURCE}$ and $I_{SINK}$ in order to maintain a desired VOD. This is accomplished by comparing a signal based on VOD to a known reference and correspondingly adjusting the output currents to compensate for either a low or high VOD.

Figure 4:
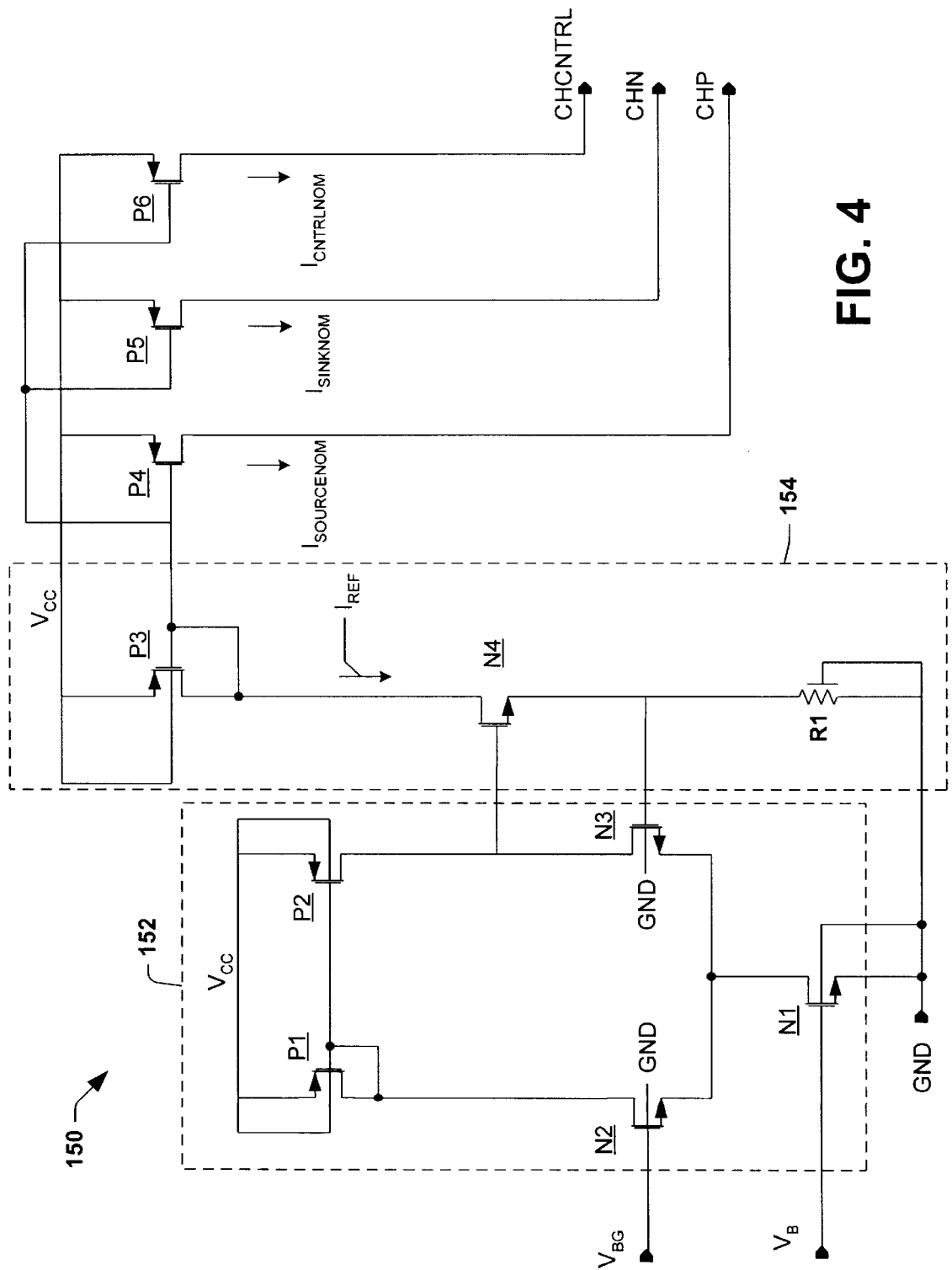
FIG. 4 illustrates an electrical schematic of current generator in accordance with an aspect of the present invention.

FIG. 4 is an electrical schematic of a current generator 150 that is used to generate reference currents employed in a differential driver in accordance with an aspect of the present invention. The current generator 150 includes a current reference 154 formed from transistor P3, transistor N4 and resistor R1 to generate a reference current $I_{REF}$. In FIG. 4, current $I_{REF}$ is established based in part on the resistance value R1. The resistance value of R1 will vary on the order of plus or minus 20% based on process limitations. As a result, $I_{REF}$ is subject to similar variations of plus or minus 20%. In current generator 150, P3 is coupled in a current mirror configuration with P4, P5, and P6 such that the current $I_{REF}$ is mirrored to three reference currents $I_{SOURCENOM}$, $I_{SINKNOM}$ and $I_{CNTRLNOM}$, which are output through terminal pins CHP, CHN and CHCNTRL, respectively. Since $I_{REF}$ is subject to variations of plus or minus 20%, the three nominal current references will also be subject to similar variations of plus or minus 20%.

Figure 5:
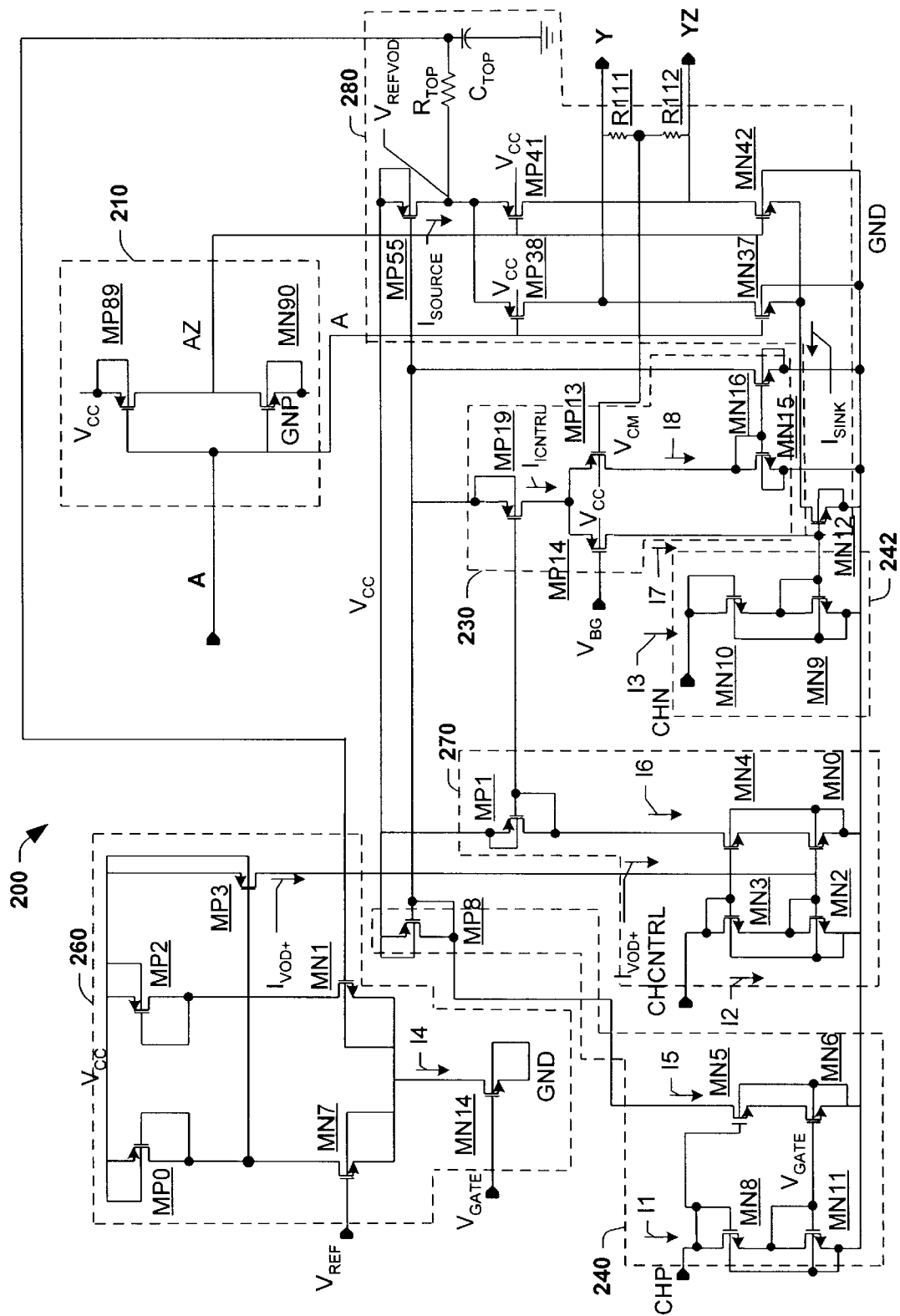
FIG. 5 illustrates a VOD correction circuit for low VOD in accordance with an aspect of the present invention.

$I_{SOURCENOM}$, $I_{SINKNOM}$ and $I_{CNTRLNOM}$ are utilized in differential driver circuit 200 of FIG. 5 to, in part, establish the nominal parameters at the output of the differential driver, (e.g. $I_{SOURCE}$, $I_{SINK}$, $V_{CM}$ and VOD). Without some type of feedback and adjustment, the output currents $I_{SOURCE}$, $I_{SINK}$ and output voltages VOD and $V_{CM}$ will be subject to similar variations. Referring again to FIG. 4, the current generator 150 includes a differential comparator 152 comprised of transistor P1, P2, N1, N2 and N3. The differential comparator 152 compares a voltage at the resistor RI with a bandgap reference voltage $V_{BG}$, which is substantially equal to the common mode voltage $V_{CM}$ (e.g., 1.2 Volts for LVDS drivers). Transistor N1 is a bias transistor that sets the current of the differential comparator 152 and is controlled by a signal $V_B$. Transistors P1 and P2 are active loads for the differential comparator 152, while transistor N2 and N3 form the differential pair of the differential comparator 152. The differential comparator 152 adds current through N4 to $I_{REF}$ in the event that the voltage across R1 is below $V_{BG}$.

FIG. 5 illustrates an electrical schematic of a differential driver circuit 200 in accordance with an aspect of the present invention. The differential driver circuit 200 provides for increasing VOD in response to a low VOD condition. This particular implementation provides for increasing the level of VOD when expected process variations cause deviations from nominal conditions, such that the nominal VOD level may be below a desired VOD level. Dashed lines in FIG. 5 are employed to help identify functionality that is implemented in a designated portion of the circuit. A data input stage 210 is provided that comprises MOSFET devices MP89 and MN90. Input stage 210 receive input signal A at the gate of the two MOSFET devices MP89 and MN90. MP89 and MN90 are coupled in series together to form an inverter circuit that provides a signal AZ that is the inverse of A. Signal A and AZ are are provided to an output stage 280.

The output stage 280 comprises MOSFET devices MP38, MP41, MN37, MN42, MP55, MN12, Resistors, R111, R112, $R_{TOP}$ and Capacitor $C_{TOP}$. MP38, MP41, MN37 and MN42 are coupled together in an H configured crosspoint switch that steers the output current to output Y or YZ based upon signals A and AZ. The current which flows between outputs Y and YZ generates the VOD when it flows through an external load of a specified value (e.g., 100 ohms). MOSFET device MP55 is coupled to MP38 and MP41 and provides current $I_{SOURCE}$ which flows through either MP41 to output YZ or through MP38 to output Y depending on the logic levels of signals A and AZ. MP55 and MOSFET device MP8 form a current mirror such that current $I_{SOURCE}$ is determined by a current $I_{SOURCEREF}$ (I5) that flows through MP8 and a source current controller 240.

Similarly, MOSFET device MN12 is coupled to MN37 and MN42 and provides current $I_{SINK}$ from output terminal Y through MN37 or from output terminal YZ through MN42 depending upon the logic levels of signals A and AZ. MN12 and MOSFET device MN9 form a current mirror such that current $I_{SINK}$ is determined by current $I_{SINKREF}$ (I3) that flows through MN9 in a sink current controller 242. R111 and R112 are resistors of substantially equal value. R111 is coupled to output Y and R112, while R112 is coupled to R111 and output YZ. One side of $R_{TOP}$ is coupled to the drain of MP55 and the sources of MP38 and MP41 and the other side of $R_{TOP}$ is coupled to $C_{TOP}$. $C_{TOP}$ is also coupled to ground. $R_{TOP}$ and $C_{TOP}$ serve to filter out AC ripple or noise on an otherwise DC signal. The common node of $R_{TOP}$ and $C_{TOP}$ provides a voltage reference signal $V_{REFVOD}$. $V_{REFVOD}$ is a signal which differs in voltage by a known amount (the voltage drop across one MOSFET device) from the higher of the two voltages at outputs Y and YZ. As will be discussed, $V_{CM}$ is controlled to a known value, therefore, the DC component of $V_{REFVOD}$ can be determined to be equal to about $V_{CM}$+½VOD+the voltage drop across one MOSFET device. $V_{REFVOD}$ is provided by the output stage 220 to a current adder 260. Voltage signal $V_{CM}$ originates at the node which couples R111 and R112 together and represents the midpoint of the voltage measured between output terminals Y and YZ.

A $V_{CM}$ regulator 230 functions to alter currents $I_{SOURCE}$ and $I_{SINK}$ when necessary to keep $V_{CM}$ at a desired level (e.g., 1.2V). The $V_{CM}$ regulator 230 comprises MOSFET devices MP13, MP14, MN15, MN16 and MP19. MP19 is coupled in a current mirror configuration with MOSFET device MP1 of a $V_{CM}$ control 270. MP19 provides current $I_{CNTRL}$ that is mirrored from I6 that flows through MP1. MP13 and MP14 are coupled together in a comparator configuration that divides $I_{CNTRL}$ into Delta $I_{SOURCE}$ (I8) and Delta $I_{SINK}$ (I7). The division of current is based on a comparison of $V_{CM}$ (coupled to MP13) and $V_{BG}$ (coupled to MP14). $V_{BG}$ is set to a known, stable voltage level substantially equal to the desired voltage level for $V_{CM}$. The comparator divides $I_{CNTRL}$ such that Delta $I_{SOURCE}$ (I8) is increased and Delta $I_{SINK}$ (I7) is decreased when $V_{CM}$ is low. Delta $I_{SOURCE}$ (I8) is decreased and Delta $I_{SINK}$ (I7) is increased when $V_{CM}$ is high. Delta $I_{SINK}$ (I7) flows though MN9 of the sink current controller 242 that is configured as a current mirror with MN12 of the output stage 280. The change in Delta $I_{SINK}$ (I7), changes $I_{SINKREF}$ (I3) in MN9 which is reflected as a change in $I_{SINK}$ through MNI12. Similarly, Delta $I_{SOURCE}$ (I8) flows through MN15. MN15 and MN16 are configured as current mirrors such that a change in Delta $I_{SOURCE}$ (I8) reflects as a change in current through MN16 which in turn changes the current $I_{SOURCEREF}$ (I5) through MP8 of the source current controller 240 which is configured as a current mirror with MN55 of the output stage 280. The change in Delta $I_{SOURCE}$ (I8) adds to $I_{SOURCEREF}$ (I5) in MP8 that is reflected as a change in $I_{SOURCE}$ through MP55.

The source current controller 240 serves to generate $I_{SOURCE}$ by combining Nominal $I_{SOURCE}$ (I1) and Delta $I_{SOURCE}$ (I8), while the sink current controller 242 serves to generate $I_{SINKREF}$ by combining Nominal $I_{SINK}$ (I3) with Delta $I_{SINK}$ (I8). The source current controller 240 comprises MOSFET devices MN8, MN11, MN5, MN6 and MP8. The sink current controller 242 comprises MOSFET devices MN 10 and MN9. Nominal $I_{SINK}$ (I3), Nominal $I_{SOURCE}$ (I1), and Nominal $I_{CNTRL}$ (I2) originate in a nominal current reference generator such as described in FIG. 4.

MN9 and MN10 are coupled together in series. Nominal $I_{SINK}$ (I3) flows through MN10 and combines with Delta $I_{SINK}$ (I7) to form $I_{SINKREF}$ that flows through MN9. Since MN9 and MN12 (output stage 280) are coupled together in a current mirror configuration, $I_{SINKREF}$ is reflected as $I_{SINK}$ through MN12. MN8 is coupled in series with MN11 and MN5 is coupled in series with MN6. Additionally, MN8 is coupled together with MN5 in a current mirror configuration and, similarly, MN11 and MN6 are coupled together in a current mirror configuration. Nominal $I_{SOURCE}$ (I1) flows through MN8 and MN11 such that a mirrored current, I5 also flows through MN5 and MN6. MP8 serves to combine I5 and a current mirrored from Delta $I_{SOURCE}$ (I8), to form $I_{SOURCEREF}$. Since MP8 and MP55 (output stage 280) are coupled together in a current mirror configuration, $I_{SOURCEREF}$ is reflected as $I_{SOURCE}$ through MP55.

The current adder circuit 260 monitors a voltage related to VOD and provides a stimulus when VOD is low that results in an increase to both $I_{SOURCE}$ and $I_{SINK}$, which thereby increases VOD. The current adder circuit 260 is a differential comparator and comprises MOSFET devices MP0, MN1, MP2, MP3, MN7 and MN14. Signal $V_{GATE}$ controls the MOSFET device MP14, which acts as a bias transistor. MN1 is coupled to MP2 and MN7 is coupled to MP0. MN1 and MN7 are coupled together in a comparator configuration and MP0 and MP2 serve as active loads for the comparator. MP3 is coupled to MN7 and to the current mirror pair MN2 and MN0 (VCM Control 270) such that $I_{VOD+}$ adds to the current flowing through the current mirror pair MN2 and MN0. The input to the gate of MN1 is $V_{REFVOD}$ which varies in direct relationship to VOD. The input to MN7 is $V_{REF}$. $V_{REF}$ is established to be equal to the desired level of $V_{REFVOD}$ for the desired level of VOD.

If VOD is at the desired voltage level, then $V_{REFVOD}$ and $V_{REF}$ are equal. In this condition, MN7 and MN1 provide equal components of current I4. If VOD is low, $I_{VOD+}$ will increase driving $V_{REFVOD}$ substantially equal to $V_{REF}$. The result is that the component of I4 provided by MN7 will increase and the component of I4 provided by MN1 will decrease. As a result, the gate of MP3 will be pulled lower and $I_{VOD+}$ will further increase through MP3. $I_{VOD+}$ is provided to the $V_{CM}$ control 270.

The $V_{CM}$ control 270 responds to $I_{VOD+}$ with a stimulus that will result in an increase in VOD. The $V_{CM}$ control 270 comprises MOSFET devices MP1, MN0, MN2, MN3, and MN4. MN3 is coupled in series with MN2 and MP1 is coupled in series with MN0 and MN4. Additionally, MN3 is coupled together with MN4 in a cascode mirror configuration and, similarly, MN0 and MN2 are coupled together in a current mirror configuration. $I_{CNTRLNOM}$ (I2) flows through MN3 to MN2 where MN2 serves to combine $I_{CNTRLNOM}$ (I2) and IVOD+into a current that is reflected to MN0 as I6. I6 flows through MN4 and MP1 where it is reflected to $I_{CNTRL}$ through MP19 of the VCM regulator 230. The change in $I_{CNTRL}$ will result in a balanced change to both Delta $I_{SOURCE}$ (I8) and Delta $I_{SINK}$ (I7). These current changes will be reflected as discussed before and will result in a balanced increase to both $I_{SOURCE}$ and $I_{SINK}$ such that VOD will be appropriately increased or decreased while maintaining the level of $V_{CM}$.

Figure 6:
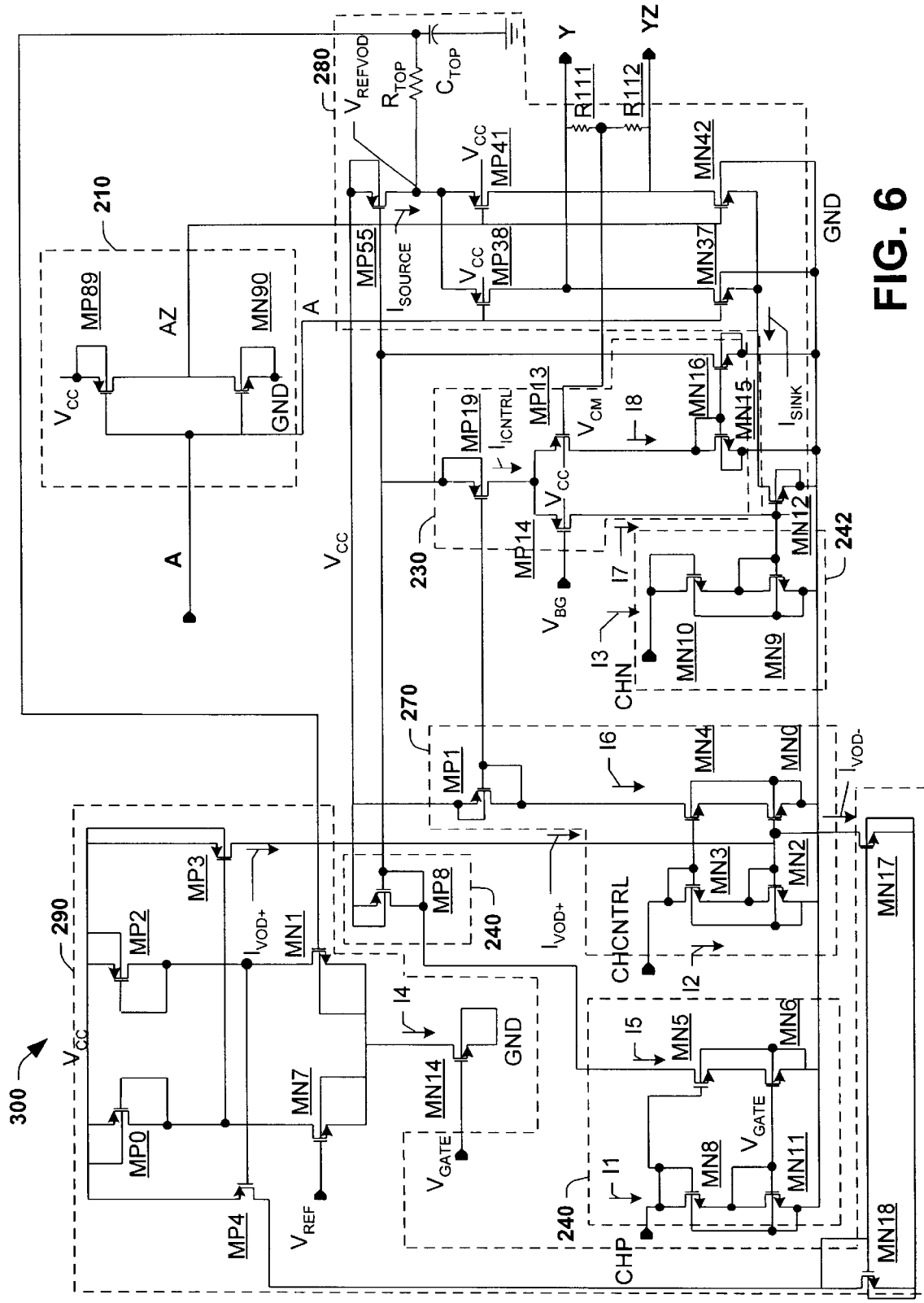
FIG. 6 illustrates a VOD correction circuit for both high VOD and low VOD in accordance with an aspect of the present invention.

FIG. 6 illustrates an electrical schematic of the differential driver circuit 300 that includes a current adder/subtractor circuit 290 in accordance with an aspect of the present invention. FIG. 6 illustrates a differential driver circuit similar to the differential driver circuit 200 of FIG. 5, but provides for decreasing VOD in response to a high VOD condition in addition to increasing VOD in response to a low VOD condition. The differential driver circuit 300 includes similar components as that described with respect to the differential driver circuit 200 (FIG. 5) except that three additional MOSFET devices MP4, MN17 and MN18 have been added to the current adder circuit 260 of FIG. 5 to provide the current/adder subtractor circuit 290 of FIG. 6. These three MOSFET devices implement the ability to subtract current from the current $I_{CNTRL}$ provided to the VCM regulator 230.

The current adder/subtractor circuit 290 monitors a voltage related to VOD and provides a stimulus when VOD is low that results in an increase to both $I_{SOURCE}$ and $I_{SINK}$, which thereby increases VOD. Similarly, when VOD is high, the current adder/subtractor circuit 290 provides a stimulus that results in a decrease to both $I_{SOURCE}$ and $I_{SINK}$, which thereby decreases VOD. The current adder/subtractor circuit 290 comprises MOSFET devices MP0, MN1, MP2, MP3, MP4 MN7, MN14, MN17, and MN18. The adder portion of the current adder/subtractor circuit 290 has been described in FIG. 5 and therefore a description of the adder portion will be omitted for the sake of redundancy.

The subtractor portion of the current adder/subtractor circuit 290 includes the addition of MP4 coupled to MN1 and to MN18, which is coupled to MN17 in a current mirror configuration such that the current flowing through MN17 is reflected to provide $I_{VOD-}$. MN 17 is coupled to current mirror pair MN2 and MN0 (VCM control 270) such that the current through MN17 reduces the currents through the current mirror pair MN2 and MN0. The input to the gate of MN1 is $V_{REFVOD}$ (filtered) which varies in direct relationship to VOD. The input to MN7 is $V_{REF}$. $V_{REF}$ is established to be equal to the desired level of $V_{REFVOD}$ for the desired level of VOD. If VOD is at the desired voltage level, then $V_{REFVOD}$ and $V_{REF}$ are equal. In this condition, MN7 and MN1 provide equal components of current I4 and the voltage level of the gates of MP3 and MP4 are such that current $I_{VOD+}$ is zero and $I_{VOD-}$ is zero.

If VOD is low, then $V_{REFVOD}$ will be less than $V_{REF}$. The result is than the component of I4 provided by MN7 will increase and the component of I4 provided by MN1 will decrease. As a result, the gate of MP3 will be pulled lower and IVOD+will increase through MP3. $I_{VOD+}$ is provided to the VCM control 270. Similarly, the gate of MP4 will rise and $I_{VOD-}$ will remain zero. If VOD is high, then $V_{REFVOD}$ will be greater than $V_{REF}$. The result is than the component of I4 provided by MN1 will increase and the component of I4 provided by MN7 will decrease. As a result, the gate of MP4 will be pulled lower and current will decrease through MP4. The gate of MP3 will rise and $I_{VOD+}$ will remain zero. $I_{VOD-}$ is provided to the VCM control 270 through the current mirror pair MN18, MN17.

The VCM control 270 responds to $I_{VOD+}$ with a stimulus that will result in an increase in VOD and similarly responds to $I_{VOD-}$ such with a stimulus that will result in a decrease in VOD. The VCM control 270 comprises MOSFET devices MP1, MN0, MN2, MN3, and MN4. MN3 is coupled in series with MN2. MP1 is coupled in series with MN0 and MN4. Additionally, MP3 is coupled together with MN4 in a current mirror configuration and, similarly, MN0 and MN2 are coupled together in a current mirror configuration. $I_{CNTRLNOM}$ (I2) flows through MN3 to MN2 where MN2 serves to combine $I_{CNTRLNOM}$ (I2), $I_{VOD-}$ and $I_{VOD+}$ into a current that is reflected to MN0 as I6. I6 flows through MN4 and MP1 where it is reflected to $I_{CNTRL}$ through MP19 of the VCM Regulator 230. The change in $I_{CNTRL}$ will result in a balanced change to both Delta $I_{SOURCE}$ (I8) and Delta $I_{SINK}$ (I7). These current changes will be reflected as discussed before and will result in a balanced increase to both $I_{SOURCE}$ and $I_{SINK}$ such that VOD will be appropriately increased or decreased while maintaining the level of $V_{CM}$.

Figure 7:
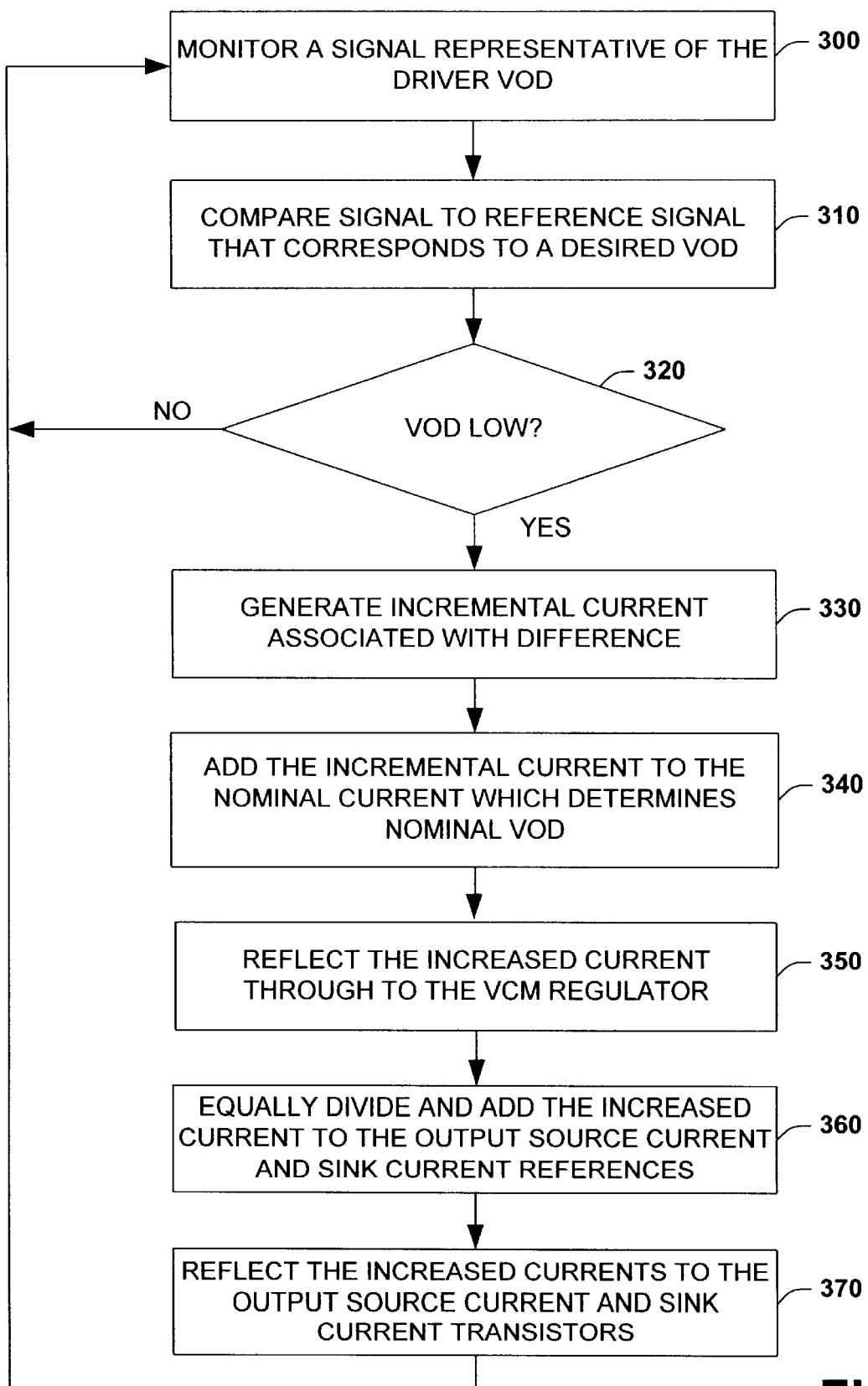
FIG. 7 illustrates a block diagram of a methodology for increasing low VOD in accordance with an aspect of the present invention.
Figure 8:
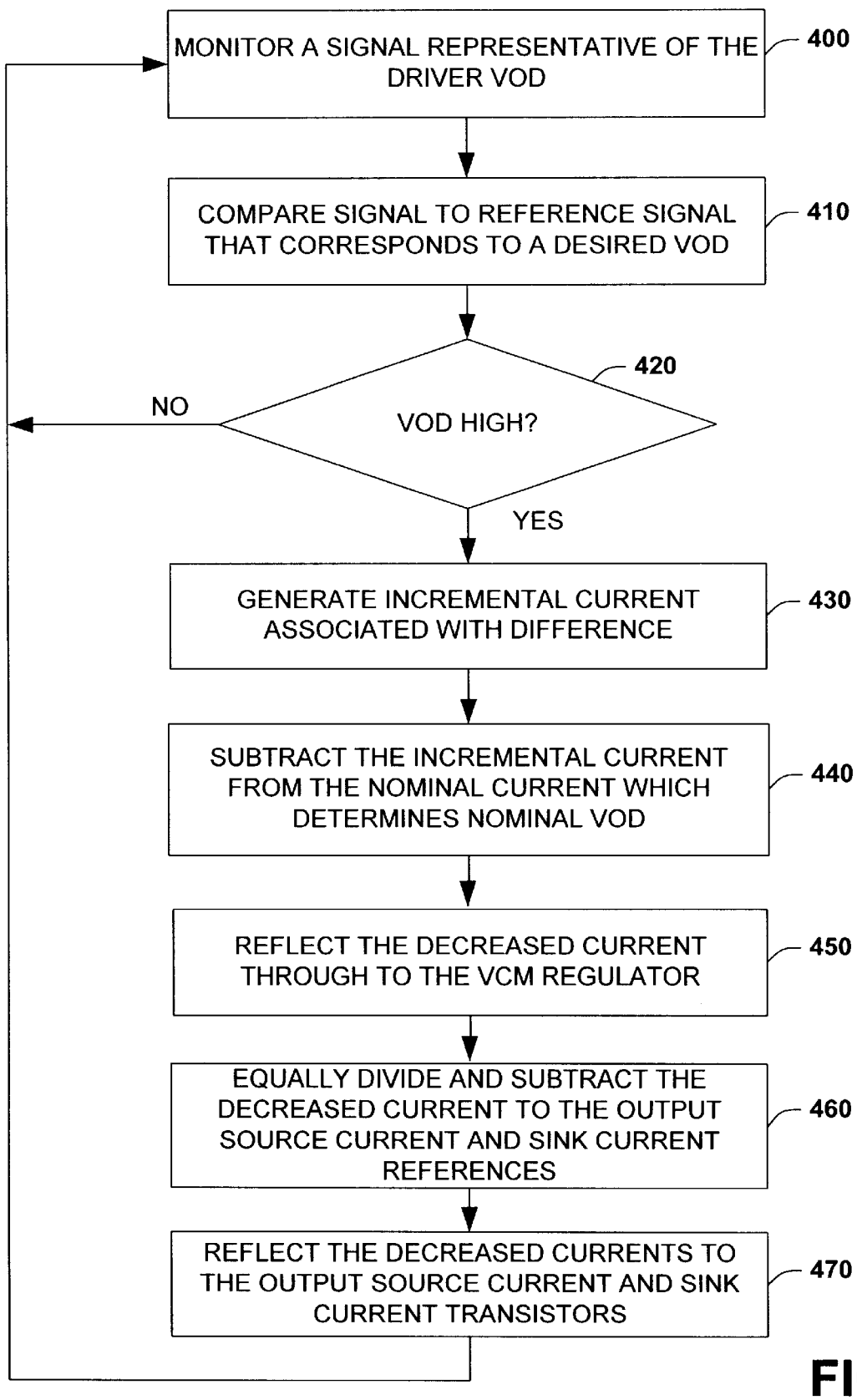
FIG. 8 illustrates a block diagram of a methodology for decreasing high VOD in accordance with an aspect of the present invention.

In view of the foregoing structural and functional features described above, methodologies in accordance with various aspects of the present invention will be better appreciated with reference to FIGS. 7–8. While, for purposes of simplicity of explanation, the methodologies of FIGS. 7–8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention. Further, the methodologies of FIGS. 7–8 may be combined and implemented together.

FIG. 7 illustrates one particular methodology for implementing a VOD correction of a current driver device (e.g., LVDS) in accordance with an aspect of the present invention. The methodology begins at 300, where a signal that is representative of an actual VOD level is monitored. The signal can be monitored at a location of the driver that the voltage is relatively constant during operation. The representative signal will then have a know relationship to the VOD of the driver device. The methodology then proceeds to 310. At 310, the representative signal is compared to a reference signal that is set to be equal to the level that the signal representative of VOD will be if VOD is at the desired level. At 320, the comparison is employed to determine if the VOD is low or below a desired VOD. If at 320, the two signals are equal, then VOD is not low (NO) and the method returns to 300 to continue to monitor the representative signal. If at 320, the representative signal is less than the reference signal, then VOD is low (YES) and the method proceeds to 330.

At 330 an incremental current is generated which is added at 340 to the nominal current that determines the nominal VOD to provide an increased current. At 350, the increased current is reflected through to a VCM regulator. At 360, the reflected increased current is equally divided and added to reference currents that determine the output source current and output sink current. At 370, the increased reference currents are reflected to the output source and output sink currents. The method then returns to 300 where the signal that is representative of VOD will continue to be monitored.

FIG. 8 illustrates another methodology for implementing a VOD correction for a current driver device (e.g., LVDS) in accordance with an aspect of the present invention. The methodology begins at 400, where a signal that is representative of an actual VOD level is monitored. The signal can be monitored at a location of the driver that the voltage is relatively constant during operation. The representative signal will then have a know relationship to the VOD of the driver device. The methodology then proceeds to 410. At 410, the representative signal is compared to a reference signal that is set to be equal to the level that the signal representative of VOD will be if VOD is at the desired level. At 420, the comparison is employed to determine if the VOD is high or above a desired VOD. If at 420, the two signals are equal, then VOD is not high (NO) and the method returns to 400 to continue to monitor the representative signal. If at 420, the representative signal is higher than the reference signal, then VOD is high (YES) and the method proceeds to 430.

At 430 an incremental current is generated which is subtracted at 440 from the nominal current that determines the nominal VOD to provide a decreased current. At 450, the decreased current is reflected through to a $V_{CM}$ regulator. At 460, the reflected decreased current is equally divided and subtracted from the reference currents that determine the output source current and output sink current. At 470, the decreased reference currents are reflected to the output source and output sink currents. The method then returns to 400 where the signal that is representative of VOD will continue to be monitored.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A differential current driver system comprising:

an input stage that receives an input signal and provides a first output signal component and a second output signal component, the second output signal component having a logic level that is the inverse of the first output signal component;

an output stage that drives a source current through one of a first terminal and a second terminal and receives a sink current through the other of the first terminal and the second terminal to introduce a Voltage Output Differential (VOD) across the first terminal and the second terminal, the output stage switching the source current and sink current between the first terminal and the second terminal based on logic levels of the first output signal component and the second output signal component:

a compensation circuit that creates a current stimulus which corrects the VOD if the VOD is not at a desired level; and the compensation circuit comprising a current adder and the stimulus is an increased current that results in an increase to at least one of the source current and the sink current.

2. A differential current driver system comprising:

an input stage that receives an input signal and provides a first output signal component and a second output signal component, the second output signal component having a logic level that is the inverse of the first output signal component;

an output stage that drives a source current through one of a first terminal and a second terminal and receives a sink current through the other of the first terminal and the second terminal to produce a Voltage Output Differential (VOD) across the first terminal and the second terminal, the output stage switching the source current and sink current between the first terminal and the second terminal based on logic levels of the first output signal component and the second output signal component; and a compensation circuit that creates a current stimulus which corrects the VOD if the VOD is not at a desired level;

wherein the compensation circuit comprises a current subtractor and the stimulus is a decreased current that results in a decrease to at least one of the source current and the sink current.

3. A differential current driver system comprising:

an input stage that receives an input signal and provides a first output signal component and a second output signal component, the second output signal component having a logic level that is the inverse of the first output signal component;

an output stage that drives a source current through one of a first terminal and a second terminal and receives a sink current through the other of the first terminal and the second terminal to produce a Voltage Outnut Differential (VOD) across the first terminal and the second terminal, the output stage switching the source current and sink current between the first terminal and the second terminal based on logic levels of the first output signal component and the second output signal component;

a compensation circuit that creates a current stimulus which corrects the VOD if the VOD is not at a desired level: and the compensation circuit comprises a current adder and a current subtractor and the stimulus is an altered current that results in a change to at least one of the source current and the sink current.

4. A differential current driver system comprising:

an input stage that receives an input signal and provides a first output signal component and a second outPut signal component, the second output signal component having a logic level that is the inverse of the first output signal component;

an ouput stage that drives a source current through one of a first terminal and a second terminal and receives a sink current through the other of the first terminal and the second terminal to produce a Voltage Output Differential (VOD) across the first terminal and the second terminal, the output stage switching the source current and sink current between the first terminal and the second terminal based on logic levels of the first output signal component and the second output signal component;

a compensation circuit that creates a current stimulus which corrects the VOD if the VOD is not at a desired level; and the compensation circuit being a differential comparator device that generates a current stimulus which adjusts the VOD when the comparator detects a difference between a signal based on the VOD and a reference signal based on the desired VOD.

5. The system of claim 4, further comprising a common mode voltage regulator device that receives a control current utilized to control the common mode voltage of the output stage, the current stimulus is combined with the control current to one of add and subtract current to at least one of the source current and sink current.

6. The system of claim 4, the signal based on the VOD is derived from a MOSFET device that supplies the source current.

7. A Low Voltage Differential Signal (LVDS) driver comprising:

an input stage that receives an input signal and provides a differential output signal;

an output stage that receives the differential output signal and steers a source current through one of a first terminal and second terminal based on a logic level of the input signal and receives a sink current through the other of the first terminal and second terminal, the source current and sink current create a voltage output differential (VOD) across the first terminal and second terminal due to an external load; and a differential comparator device that generates a current stimulus which adjusts the VOD when the comparator detects a difference between a signal based on the VOD and a reference signal based on a desired VOD.

8. The driver of claim 7, further comprising a common mode voltage regulator device that receives a control current utilized to control the common mode voltage of the output stage, the current stimulus is combined with the control current to one of add and subtract current to at least one of the source current and sink current.

9. The driver of claim 8, further comprising a source control circuit, a sink control circuit and a common mode control circuit that receive a nominal source current, a nominal sink current and a nominal control current, respectively, the nominal source current is reflected to produce the source current through at least one current mirror, the nominal sink current is reflected to produce the sink current through at least one current mirror and the nominal control current is reflected to the common mode voltage regulator through at least one current mirror to produce the control current utilized to control the common mode voltage of the output stage.

10. The driver of claim 9, further comprising a nominal current reference generator circuit that generates the nominal source current, the nominal sink current and the nominal control current.

11. The driver of claim 7, the differential comparator device comprising a current stimulus portion that generates the current stimulus and a comparator portion that detects a difference between a signal based on the VOD and a reference signal based on a desired VOD.

12. The driver of claim 11, the current stimulus portion comprises a current adder that results in an increase to at least one of the source current and the sink current in response to the comparator portion detecting a low VOD.

13. The driver of claim 11, the current stimulus portion comprises a current subtractor that results in a decrease to at least one of the source current and the sink current in response to the comparator portion detecting a high VOD.

* * * * *